United States Patent
Huang et al.

(10) Patent No.: US 6,973,631 B2
(45) Date of Patent: Dec. 6, 2005

(54) SCAN INSERTION WITH BYPASS LOGIN IN AN IC DESIGN

(75) Inventors: Steve C. Huang, Saratoga, CA (US); Ihao Chen, San Jose, CA (US)

(73) Assignee: Incentia Design Systems Corp., Hsinchu (TW)

(*) Notice: Subject to any disclaimer, the term of this patent is extended or adjusted under 35 U.S.C. 154(b) by 0 days.

(21) Appl. No.: 10/435,329

(22) Filed: May 9, 2003

(65) Prior Publication Data

US 2004/0015788 A1    Jan. 22, 2004

Related U.S. Application Data

(60) Provisional application No. 60/397,094, filed on Jul. 18, 2002.

(51) Int. Cl.[7] ............................................. G06F 17/50
(52) U.S. Cl. ................. 716/4; 716/1; 716/18
(58) Field of Search ..................... 716/1, 3–4, 17–18; 714/30, 726–727, 729

(56) References Cited

U.S. PATENT DOCUMENTS

| | | | |
|---|---|---|---|
| 5,337,321 A | 8/1994 | Ozaki | |
| 5,504,756 A | 4/1996 | Kim et al. | |
| 5,592,493 A | 1/1997 | Crouch et al. | |
| 5,661,733 A | 8/1997 | Schoessow | |
| 5,696,771 A | 12/1997 | Beausang et al. | |
| 5,703,789 A | 12/1997 | Beausang et al. | |
| 5,717,702 A | 2/1998 | Stokes et al. | |
| 5,828,579 A | 10/1998 | Beausang | |
| 5,831,868 A | 11/1998 | Beausang et al. | |
| 5,903,466 A | 5/1999 | Beausang et al. | |
| 5,943,490 A | 8/1999 | Sample | |
| 5,949,692 A | 9/1999 | Beausang et al. | |
| 6,012,155 A | 1/2000 | Beausang et al. | |
| 6,067,650 A | 5/2000 | Beausang et al. | |
| 6,088,823 A | 7/2000 | Ayres et al. | |
| 6,106,568 A | 8/2000 | Beausang et al. | |
| 6,141,790 A | 10/2000 | Beausang et al. | |
| 6,195,776 B1 | 2/2001 | Ruiz et al. | |
| 6,269,463 B1 | 7/2001 | Duggirala et al. | |
| 6,393,592 B1 | 5/2002 | Peeters et al. | |
| 6,405,355 B1 | 6/2002 | Duggirala et al. | |
| 6,415,426 B1 | 7/2002 | Chang et al. | |
| 6,434,733 B1 | 8/2002 | Duggirala et al. | |
| 6,539,520 B1 * | 3/2003 | Tiong et al. | 716/3 |

* cited by examiner

OTHER PUBLICATIONS

"Scan Testability Guidelines", Atmel, Rev. 1312A-12/99, pp. 15-21.

*Primary Examiner*—Paul Dinh
(74) *Attorney, Agent, or Firm*—Morrison & Foerster LLP (57) ABSTRACT

A computer implemented process of inserting enhanced scan bypass in relation to a bypassed block in an integrated circuit design comprising: receiving an HDL description of the circuit design; wherein the HDL description includes a port specification HDL instruction that specifies port properties of a bypassed block; wherein the HDL description includes an enhanced bypass HDL instruction that specifies how many scan cells to provide per port of the bypassed block in a scan bypass circuit that bypasses the bypassed block; wherein the bypass HDL instruction includes a user-selectable option of at least zero or one or two scan cells per port; in response to the specification HDL instruction and the enhanced bypass HDL instruction, automatically generating a netlist portion that includes scan a bypass circuit that bypasses the bypassed block and that includes the specified number of scan cells per port.

14 Claims, 7 Drawing Sheets

SCAN INSERTION WITH BYPASS LOGIN IN AN IC DESIGN

CROSS REFERENCE TO RELATED APPLICATION

This application claims priority to and benefit of the filing date of provisional patent application Ser. No. 60/397,094, filed Jul. 18, 2002, which is incorporated herein by this reference.

BACKGROUND OF THE INVENTION

1. Field of the Invention

The invention relates in general to electronic circuit design and more particularly to scan chains in electronic circuit design.

2. Description of the Related Art

Modern integrated circuit (IC) design has evolved into a specialized field often referred to as electronic design automation in which computers and computer aided design (CAD) techniques are used to automate the IC chip design process. Generally, an IC circuit design process begins with an engineer using a high level design language (HDL) such as Verilog or VHDL, to describe the input/output signals, functionality and performance characteristics of the circuit. This information is provided to a computer that runs a logic synthesis program that generates or compiles a specification defining the integrated circuit in terms of a particular technology (e.g., very large scale integration). More specifically, the specification may include a netlist that specifies the interconnection of functional cells in the circuit. The specification serves as a template for the design of a physical embodiment of the circuit in terms of transistors, input pins, output pins, wiring and other features involved in the layout of the chip. The layout is a geometric or physical description of the IC that may consist of a set of geometric shapes in several layers.

An IC chip layout is designed by providing the specification to a computer that runs computer aided design programs that determine an optimal placement of functional cells and an efficient interconnection or routing scheme between cells to achieve the specified functionality. Placement is a process to assign location and orientation of a library cell or of IP (intellectual property) in a predefined area usually called a floorplan of an IC. Intellectual property may be a licensed proprietary design component, for example. Placement result is a resulting specification of the position and orientation of cells or IP relative to each other in a floorplan of an IC design. Computer implemented placement algorithms assign locations to the functional cells so that they do not overlap, so that chip area usage is optimized and so that interconnect distances are minimized. Chip area optimization permits more functional cells to fit into a given chip area. Wire length minimization reduces capacitive delays associated with longer nets so as to speed up the operation of the chip. Routing typically follows placement in the layout design flow. Computer implemented routing algorithms determine the physical distribution of wire interconnects through the available space.

As integrated circuits have become more complex and densely packed with gates, they have become progressively more difficult to test in order to ensure desired functionality. As a result, testability has become an increasingly more important and challenging goal of the integrated circuit design process. Computer programs that aid in the design of testability circuitry for integrated circuits are often referred to as design for test (DFT) processes. One approach to DFT, for example, is to take a netlist representing an integrated circuit design generated and to add and/or replace certain memory cells and associated circuitry of the netlist with special memory cells, called scan cells. Scan cells are designed to allow application of test vectors to certain portions of an integrated circuit produced according to the design.

Scan cells are interconnected to form scan chains. During test mode operation, scan test vectors in the form of a series of logical 1 and logical 0 test vector values are loaded into the scan cells of a scan chain. The circuit is caused to operate for a prescribed number of clock cycles using the test vectors as input. The results of the circuit operation can be captured in the form of logical 1 and logical 0 scan test results values. Scan test vectors and scan test results shall be referred to collectively as scan data. The same scan chain scan cells used to read in the test vectors can be used to capture the test results. The captured values are read out of the scan chain for observation. The results can be compared with expected results to determine whether the circuit operates as expected and to thereby determine whether defects are present.

Mission mode circuitry comprises those portions of the IC designed to perform the circuit's intended purpose, such as to serve as an adder or shift register or some application specific logical function. Test mode circuitry comprises those portions of an IC designed to facilitate testability. Scan cells perform dual roles. During mission mode operation, the scan cells serve as memory components within the functional design. During test mode operation, scan cells serve to input test vectors and capture test results.

Figure 1:
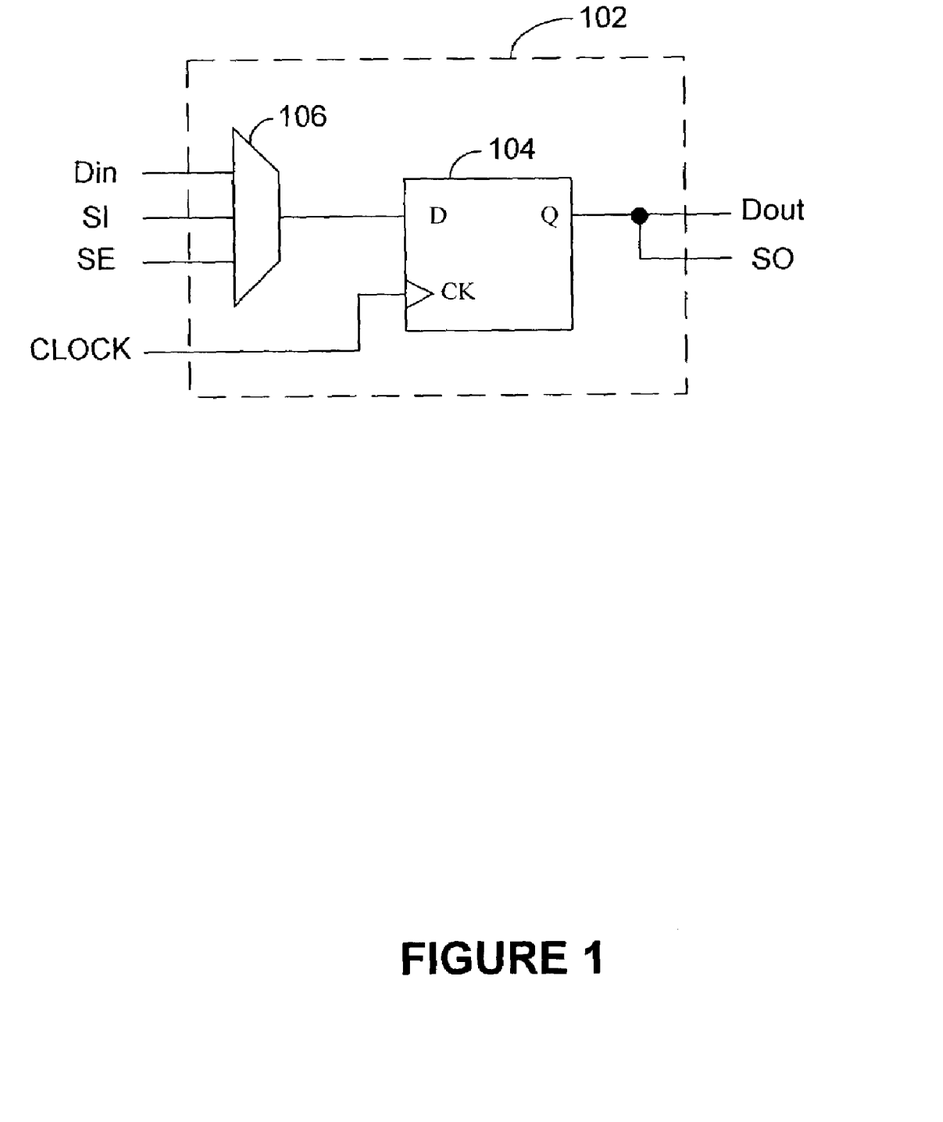
FIG. 1 is an illustrative drawing of one example of a scan cell comprising a D-flip-flop (dff) and a multiplexer.

FIG. 1 is an illustrative drawing of one example of a scan cell 102 comprising a D-flip-flop (dff) 104 and a multiplexer 106. The multiplexer 106 receives as input a data value (D) and a scan-in value (SI). The multiplexer provides its output to a D input of the dff 104. A scan enable (SE) control input (SE) controls whether the multiplexer 106 provides the D value or the SI value to the D input of the multiplexer. In mission mode, the multiplexer 106 provides the D input to the D input of the dff. In test mode, the multiplexer 106 provides the SI input to the D input of the dff 104. A Q output of the dff 104 serves as a mission mode data output during mission mode operation and serves as a scan mode output (SO) during test mode operation. It will be appreciated that the scan cell of FIG. 1 shows just one example of a type of scan cell that may be employed consistent with the present invention. Persons skilled in the art will appreciate that other types of scan cells may be used instead.

Testability of a circuit can be characterized as a measure of controllability and observabiltiy of logic values of prescribed nodes within the circuit. A circuit node might be an output node of a prescribed combinational logic block or module within the circuit, for example. A circuit may have thousands of circuit nodes to be tested. Controllability of a circuit node is a measure of the difficulty (or ease) of driving it to either a logic 1 state or to logic 0 state. Low controllability of a circuit node generally means that it will be more difficult to impose a desired logic level upon the node, which means that test vector generation ordinarily will be more difficult as well. Observability of a circuit node is a measure of the difficulty (or ease) of propagating a logic level at the node to a directly observable output. It will be appreciated that a fault in a circuit can be detected only if an error signal can be propagated to an IC output.

Scan chains are inserted so as to achieve desirable levels of controllability and observability of circuit nodes within an IC design. Test vectors applied through scan chains are used to drive logic values onto the circuit nodes. The same scan chains are used to propagate the resulting logic values from the circuit nodes to externally accessible nodes. Generally, an error signal represents a difference between a value that was to be driven to the circuit node by a test vector and an actual value resulting at the node due to a test vector. Observability and controllability of a circuit node ordinarily are balanced with each other since it is not so useful to have high controllability of a circuit node if its logic value cannot be easily propagated to an IC output. Conversely, it is not so useful to have a high observability of a circuit node if the node cannot be readily driven to a desired logic value from a test vector applied to circuit inputs.

In a System-On-Chip (SOC) design it is common to use IP such as compiled block memory and/or processor cores, for example. These blocks and cores may have their own built-in-self-test (BIST) to cover their own testability issues. From a scan insertion perspective, these blocks and cores may be viewed as 'black boxes' that can be bypassed without significant loss of testability. There has been a need for improvements in the insertion of scan bypass circuits. Moreover, in general, there also has been a need for improvements in observability and controllability of interfaces between IP used in a circuit design and other logic modules in the design. The present invention meets these needs.

SUMMARY OF THE INVENTION

One aspect of the invention provides a computer implemented process for inserting enhanced scan bypass in relation to a bypassed block in an integrated circuit design. An HDL description of the circuit design includes a port specification HDL instruction and an enhanced bypass HDL instruction. The port specification HDL instruction specifies port properties of a bypassed block. The enhanced bypass HDL instruction specifies how many scan cells to provide per port of the bypassed block in a scan bypass circuit that bypasses the bypassed block. The enhanced bypass HDL instruction includes a user-selectable option of at least zero or one or two scan cells per port. A netlist is generated automatically in response to the specification HDL instruction and the enhanced bypass HDL instruction. The netlist includes a bypass circuit that bypasses the bypassed block and that includes the specified number of scan cells per port.

Another aspect of the invention comprises an article of manufacture comprising a computer readable medium encoded with an HDL description of a circuit design. The HDL description includes a port specification HDL instruction that specifies the port properties of a bypassed block. The HDL description also includes an enhanced bypass HDL instruction that specifies how many scan cells to provide per port of the bypassed block in a scan bypass circuit that bypasses the bypassed block. The enhanced bypass HDL instruction includes a user-selectable option of at least zero or one or two scan cells per port. The computer readable medium also is encoded with computer program code that automatically generates a netlist portion that includes scan bypass circuitry that bypasses the bypassed block and that includes the specified number of scan cells per port. The computer code operates in response to the specification HDL instruction and the enhanced bypass HDL instruction.

DETAILED DESCRIPTION OF THE PREFERRED EMBODIMENTS

The following description is presented to enable any person skilled in the art to make and use the invention, and is provided in the context of particular applications and its requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the are would realize that the invention might be practiced without the use of these specific details. In other instances, well known structures and devices are shown in block diagram form in order not to obscure the description of the invention with unnecessary detail. Thus, the present invention is not intended to be limited to the embodiments shown, but is to be accorded the widest scope consistent with the principles and features disclosed herein.

Figure 2:
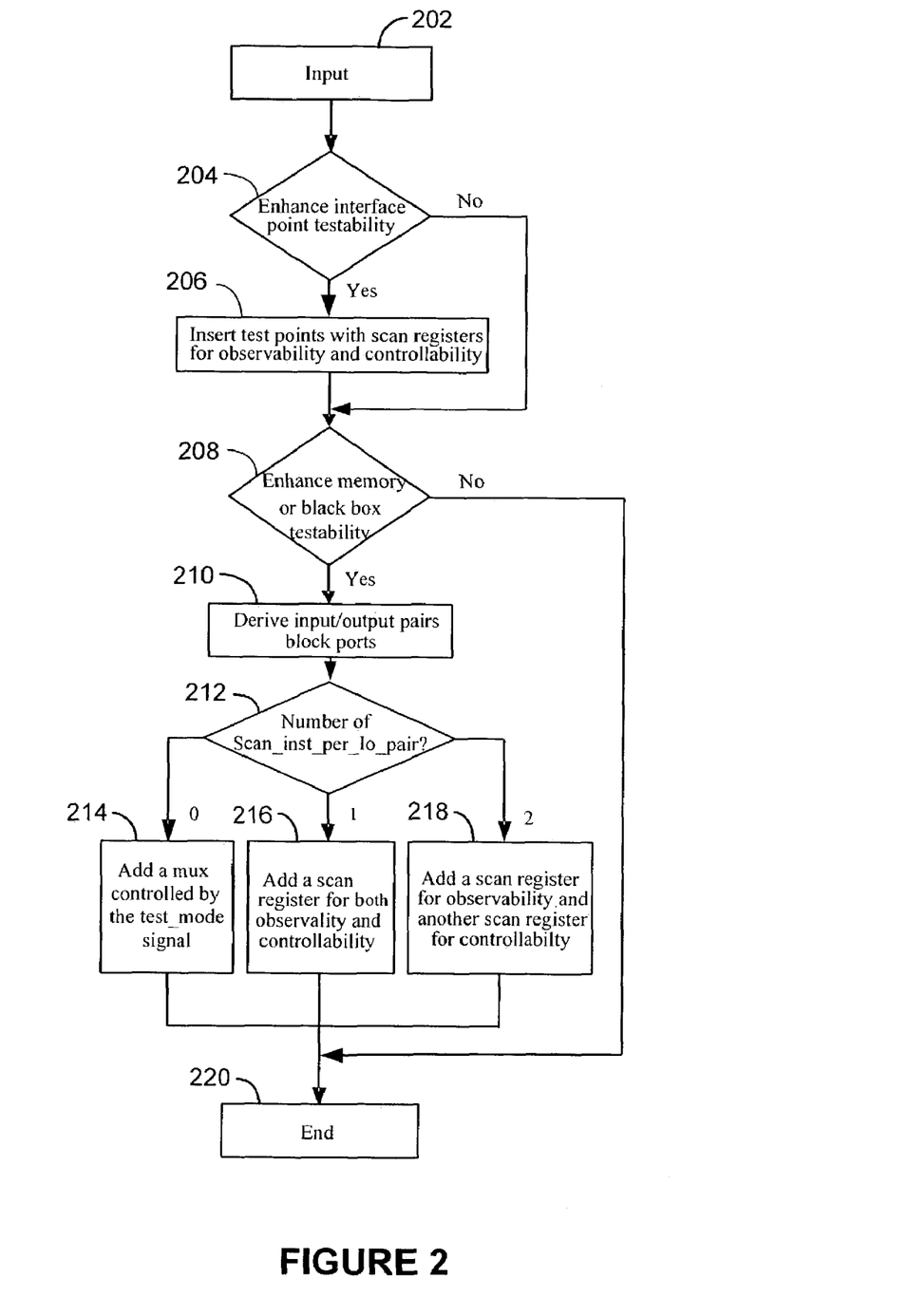
FIG. 2 is an illustrative drawing of a computer software implemented scan insertion process flow in accordance with a present embodiment of the invention.

FIG. 2 is an illustrative drawing representing a computer program scan insertion process flow 200 in accordance with a present embodiment of the invention. Persons skilled in the art will understand that this computer program process can be encoded in computer readable medium and can be implemented in a general purpose computer. In step 202 an HDL description of a circuit design is input. In decision step 204 a determination is made as to whether to enhance interface testability of an IP block. Enhanced interface test point testability is a user selectable option, which, for example, may be expressed in the HDL description. Assuming that the decision is to make the insertion, then in step 206 test points are inserted between the IP block and other logic in the IC for controllability and observability.

In decision step 208 a determination is made as to whether to enhance memory block or other 'black box' testability. In this disclosure it is assumed that a design may have a component or sub-system such as a memory block or other 'black box' that for some reason is to be bypassed during scan insertion. In this disclosure, such component or sub-system shall be referred to as a bypassed block since it represents a block of sequential or combinitorial circuitry that is to be bypassed by a scan chain used to test other nearby circuitry. For example, such bypassed circuitry may contain its own built-in-self-test circuitry which obviates the need to insert scan cells to test its functionality. Enhanced memory or black box testability is a user selectable option that, for example, permits a designer to select the degree of controllability and observability of scan data at locations adjacent the input and output ports of such bypassed blocks. The enhanced memory or black box testability option may be expressed in the HDL description.

Assuming that enhanced testability is elected, then in step 210, input/output port pairs are determined for the ports of a bypassed block. Input/output port pairs are described in a port description HDL instruction. In decision step 212, a determination is made as to the number of scan cells to insert per input/output port pair. The number of scan cells per input/output port pair is a user selectable option that, for example, is expressed in an enhanced bypass HDL instruction.

If decision step 212 determines that the enhanced bypass HDL instruction specifies that zero (0) scan cells are to be added, then in step 214 a multiplexer is added for each input/output port pair. If decision step 212 determines that the enhanced bypass HDL instruction specifies that one (1) scan cell is to be added, then in step 216 one scan cell is added for each input/output port pair for both observability and testability. If decision step 212 determines that the enhanced bypass HDL instruction specifies that two (2) scan cells are to be added, then in step 218 one scan cell is added for observability for each input/output port pair, and another scan cell is added for controllability for each input output port pair. In step 220, the netlist updated as determined in steps 208 and 212 is provided for further processing.

In a present embodiment of the invention a enhanced bypass HDL instruction has the following syntax:

(*) set_dft-bypass:.

A port description HDL instruction has the following syntax:

(*) set_port_spec:

A more detailed example of the syntax of an HDL expression of the enhanced bypass HDL instruction is:

set_dft_bypass?-
    num_scan_cell_per_io_pair{0|1|2} ?

object_list

The instruction permits selection of 0, 1 or 2 scan cells per input/output port pair. An object identified on the object list is subject to the specified enhanced bypass. A default bypass setting may be selected automatically if no particular one of Ø or 1 or 2 is specified.

A more detailed example of the syntax of an HDL expression of the port description HDL instruction is:

set_port_spec ?-cell_object_list?

?-data_in in term obj list?

?-data_out out term obj list?

The instruction specifies cell type. For example, there may be multiple different types of memory blocks or other black boxes that ordinarily are to be bypassed by scan chain circuitry. The instruction also specifies which input pins and which output pins are to be subject to enhanced scan. In this example, the bypassed block cell is assumed to have a set of input ports and output ports.

Figure 3:
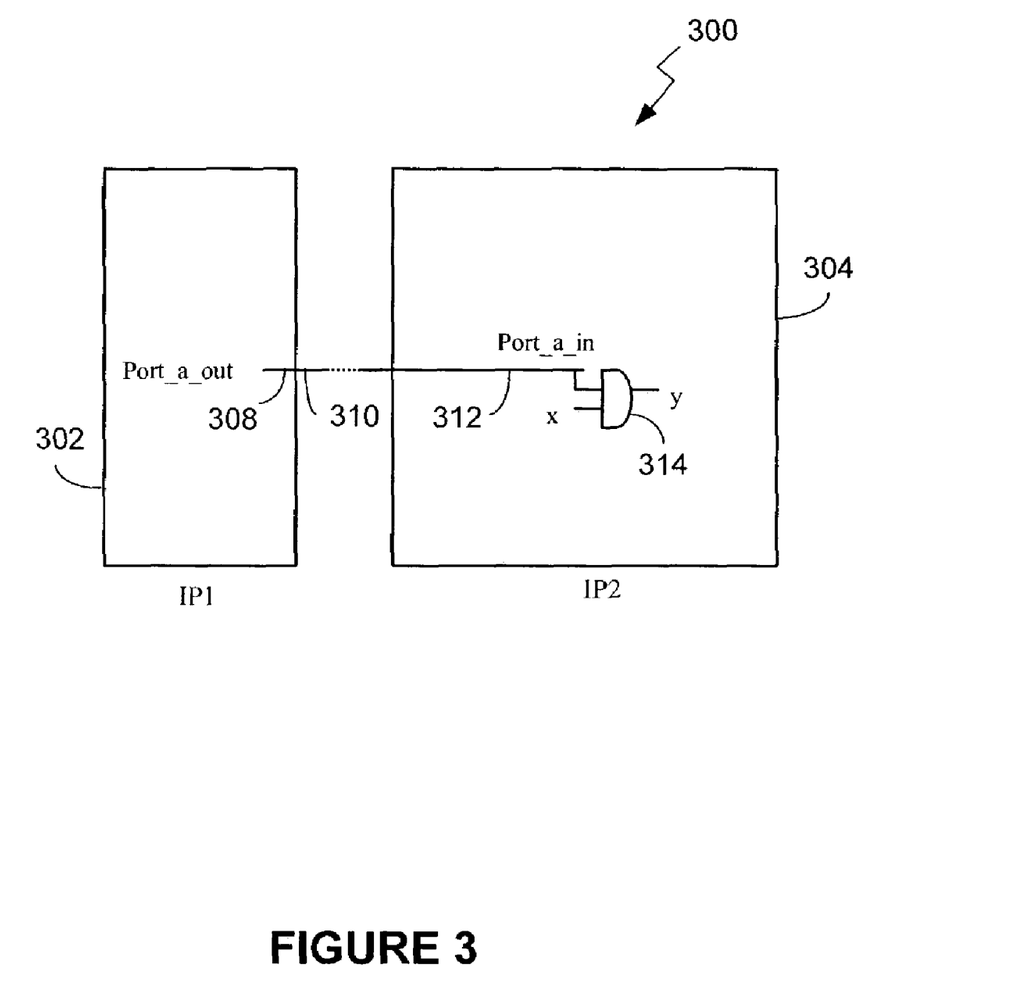
FIGS. 3–4 are illustrative drawings representing a netlist before and after automatic scan cell insertion for observability and testability of an IP interface in accordance with the process of FIG. 2.
Figure 4:
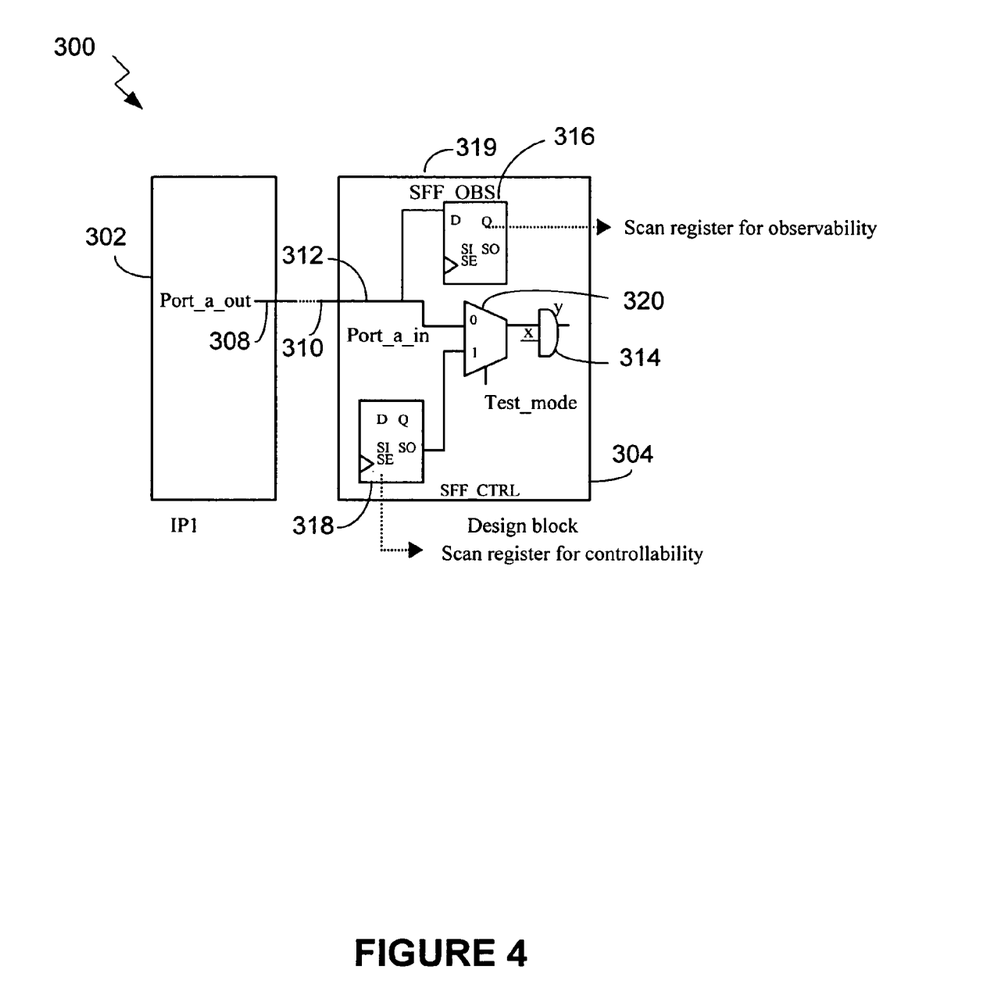

FIGS. 3–4 are illustrative drawings representing a netlist 300 before and after scan cell insertion for observability and testability of an IP interface. Scan cells may be inserted automatically pursuant to steps 204–206 of the process of FIG. 2. FIG. 3 shows a portion of the netlist 300 before scan insertion. FIG. 4 shows a portion of the same netlist 300 after scan insertion. Identical reference numerals are used to identify identical components in these two drawings.

The netlist 300 includes an IP block 302 and a design block 304. A port_a_out 308 of the IP block 302 is connected via wire 310 to a port_a_in 312 to the design block 304. The design block 304, for example, may comprise a custom design circuit block specified by a user in a HDL for instance. Gate 314 represents combinational logic of design block 304 that receives logic input from the port_a_in 312. It will be appreciated that only one input/output port pair (port_a) is shown in FIGS. 3–4, although there may be a plurality of such pairs interconnecting IP block 302 and design block 304.

FIG. 4 shows the same netlist 300 with a scan cell 316 added for observability, a scan cell 318 added for controllability and a multiplexer 320 to control selection between mission mode operation and test mode operation. During mission mode operation, multiplexer 320 connects port_a_in to gate 314. During test mode operation, multiplexer 320 can connect a scan output (SO) node of controllability scan cell 318 to gate 314. Also, during test mode operation, a scan-in value can be provided to the scan-in (SI) node of the controllability scan cell 318. Moreover, a port_a value can be input to a SI node of observability scan cell 316 which, in turn, can be output for observability via a SO node of the observability scan cell 316. Thus, in FIG. 4, an interface between IP block 302 and design block 304 has been modified to add scan cells to enhance controllability and observability during test mode operation.

Figure 5:
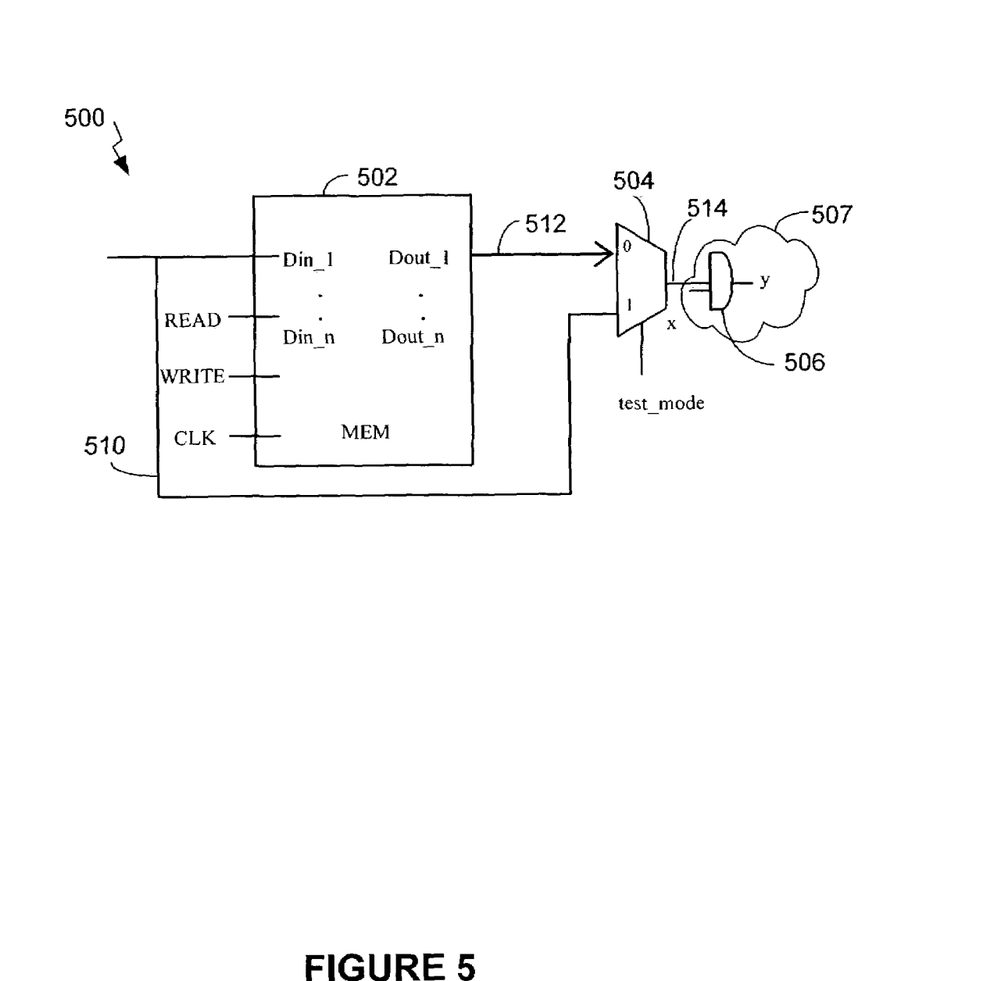
FIG. 5 is an illustrative drawing of a portion of a netlist that includes a black box and a bypass multiplexer automatically assembled in accordance with the process of FIG. 2.
Figure 6:
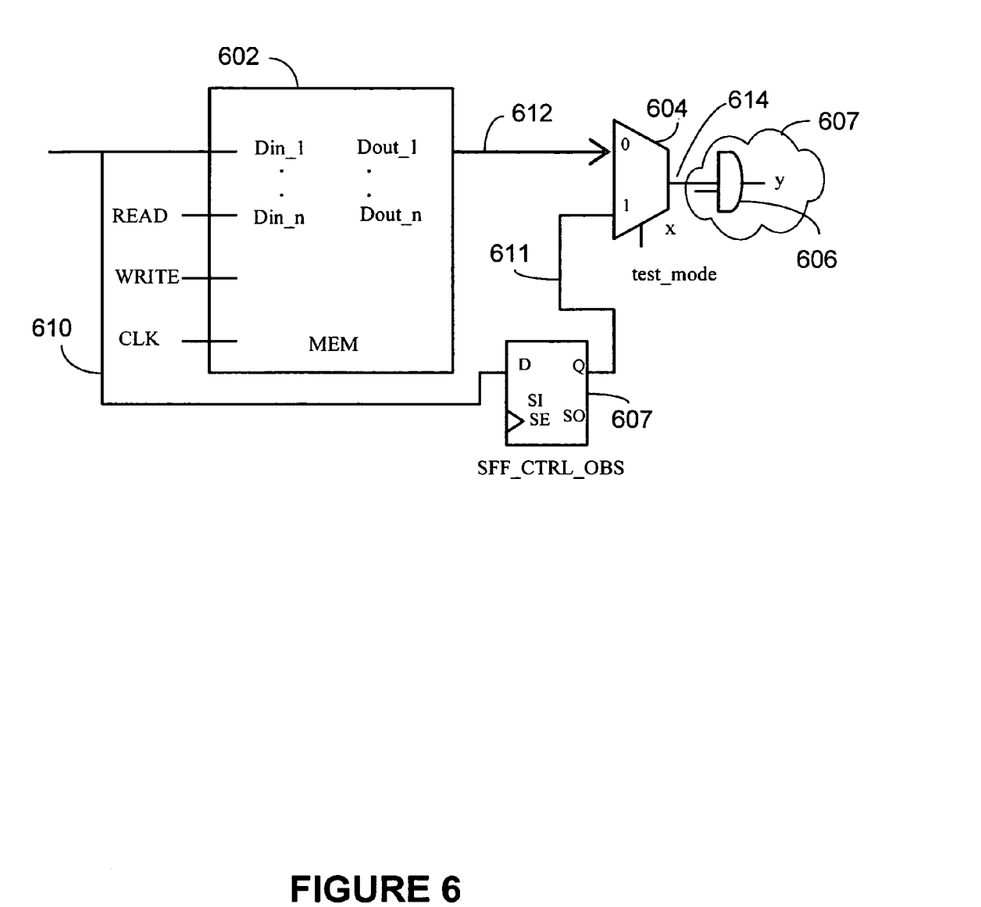
FIG. 6 is an illustrative drawing of a portion of a netlist that includes a black box, a bypass multiplexer and a bypass scan cell automatically assembled in accordance with the process of FIG. 2.
Figure 7:
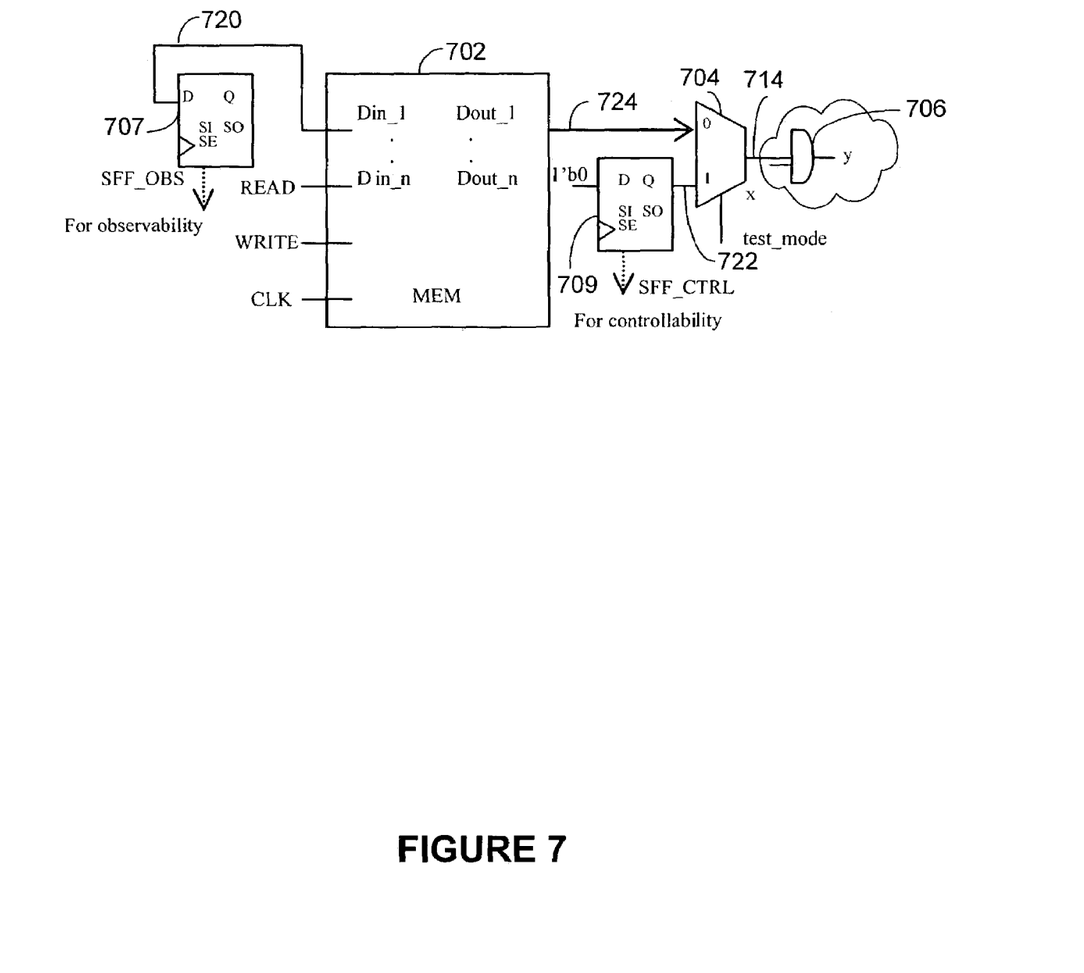
FIG. 7 is an illustrative drawing of a portion of a netlist that includes a black box, a bypass multiplexer, an observability bypass scan cell and an controllability bypass scan cell automatically assembled in accordance with the process of FIG. 2.

FIGS. 5–7 illustrate different netlists resulting from selection of the enhanced bypass option with zero (0), one (1) and two (2) scan cells, respectively. The example netlists shown in these three figures result from steps 214, 216 and 218 of FIG. 2. Enhanced scan bypass circuitry of FIG. 5 includes zero scan cells per I/O port pair. Enhanced scan bypass circuitry of FIG. 6 includes one scan cell per I/O port pair. Enhanced scan bypass circuitry of FIG. 7 includes two scan cells per I/O port pair. The bypass circuitry of FIG. 5 provides the least fault coverage since it has no additional scan cell per I/O pair. The circuitry of FIGS. 6–7 have more scan cells than that of FIG. 5 and therefore, potentially provide better fault coverage.

Bypass circuit insertion in accordance with a present embodiment of the invention automates the process of inserting scan bypass circuits that can enable scan chains to bypass black box components of an IC design. Such bypass circuitry can be inserted in concert with scan cells with which it will be interconnected in scan chains. However, scan implementation, the connection of scan cells to form scan chains, is a process separate from bypass insertion.

FIG. 5 is an illustrative drawing of a portion of a netlist 500 resulting from steps 208–212 and 214 of FIG. 2. The netlist 500 includes a bypassed block 502, a multiplexer 504 and gate 506 representing design logic, indicated by cloud 507. In this example netlist, the bypassed block 502 is a memory block including read control input, write control input clock input, a plurality (n) of data inputs $D\_in\_1$ to $D\_in\_n$ and a plurality of data outputs $D\_out\_1$ to $D\_out\_n$. For each respective $D\_in/D\_out$ pair, a respective bypass wire 510 interconnects the $D\_in$ port to one input of a corresponding multiplexer 504, and another input of the corresponding multiplexer 504 is connected via wire 512 to the respective $D\_out$ port. An output of the multiplexer is coupled via wire 514 to an input of gate 506. Multiplexer 504 and associated wires 510, 512, 514 can be added automatically pursuant to steps 212 and 214, for example. It will be appreciated that additional multiplexer circuitry and bypass wires may be provided for each input/output (D_in/D_out) pair, although in order to simplify the drawing, only one multiplexer 504 and only one associated set of bypass wires 510, 512, 514 is shown.

During test mode operation, the multiplexer 504 propagates to gate 506 scan test signals on bypass wire 510. During mission mode operation, the multiplexer 504 propagates to gate 506 to a respective D_out signal on line 512.

FIG. 6 is an illustrative drawing of a portion of a netlist 600 resulting from steps 208–212 and 216 of FIG. 2. The netlist 600 includes a bypassed block 602, a multiplexer 604 and design logic represented by gate 606 representing design logic, indicated by cloud 607. The netlist portion 600 also includes scan cell 607. In this example, the bypassed block 602 is identical to the bypassed block 502 of FIG. 5, and the description of bypassed block 502 applies to bypassed block 602 as well. For each respective D_in/D_out pair, a respective bypass wire 610 interconnects the D_in port to one input of a corresponding data in (D) node of scan cell 607. One input of the multiplexer 604 is coupled via wire 611 to a data out (Q) node of the scan cell 607. Another input of the corresponding multiplexer 604 is coupled via wire 612 to the respective D_out port. An output of the multiplexer 604 is coupled via wire 614 to an input of gate 606. Multiplexer 604, scan cell 607 and associated wires 610, 611, 612 and 614 can be added automatically pursuant to steps 212 and 216, for example. It will be appreciated that additional multiplexer circuitry and bypass wires may be provided for each input/output (D_in/D_out) pair, although in order to simplify the drawing, only one multiplexer 604 and only one scan cell 607 and only one associated set of wires 610, 611, 612 and 614 is shown.

During test mode operation, the scan cell 607 and multiplexer 604 propagates to gate 606 scan test signals on bypass wires 610–611. During mission mode operation, the multiplexer 604 propagates to gate 606 a respective D_out signal on line 612.

The scan-in (SI) node and scan-out (SO) node of 607 are interconnected in a scan chain (not shown) during a scan implementation process which forms no part of the present invention.

FIG. 7 is an illustrative drawing of a portion of a netlist 700 resulting from steps 208–212 and 218 of FIG. 2. The netlist 700 includes a bypassed block 702, a multiplexer 704 and design logic represented by gate 706. The netlist portion 700 also includes an observability scan cell 707 and a controllability scan cell 709. In this example, the bypassed block 702 is identical to the bypassed block 502 and 602 of FIGS. 5–6, and the description of bypassed block 502 applies to bypassed block 702 as well. For each respective D_in/D_out pair, a respective first bypass wire 720 couples a data in (D) node of the observability scan cell 707 to an associated D_in node of the black box 702. A respective second bypass wire 722 couples a data out (Q) node of the controllability scan cell 709 to one input of the multiplexer 704. A corresponding D_out node of the black box 702 is coupled by third wire 724 to another input of multiplexer 704. An output of the multiplexer 704 is coupled via wire 714 to an input of gate 706. Multiplexer 704, observability scan cell 707 controllability scan cell 709 and associated wires 720, 722, 724 and 714 can be added automatically pursuant to steps 212 and 218, for example. It will be appreciated that additional multiplexer circuitry, observability and controllability and associated wires may be provided for each input/output (D_in/D_out) pair, although in order to simplify the drawing, only one multiplexer 704 and only one pair of observability and controllability scan cells 707, 709 and associated set of wires 720, 722, 724 and 714 is shown.

During test mode operation, the contents of the observability scan cell 707 can be output for observation via its scan-out (SO) node. Also, during test mode operation, a scan value can be input to the scan-in (SI) node of the controllability scan cell 709. That controllability scan-in value then can be read out of the controllability scan cell 709 and input via wire 722 to the other input to multiplexer 704. Multiplexer 704, in turn, propagates the controllability scan value to gate 706 via wire 714. During mission mode operation, the multiplexer 704 propagates to gate 706 to a respective D_out signal on line 724.

The scan-out (SO) node of scan cell 707 and the scan-in (SI) node of scan cell 709 are interconnected in a scan chain (not shown) during a scan implementation process which forms no part of the present invention.

It will be understood that the foregoing description and drawings of preferred embodiments in accordance with the present invention are merely illustrative of the principles of the invention. Various modifications can be made by those skilled in the art without departing from the spirit and scope of the invention.

What is claimed is:

1. A computer implemented process of inserting scan chain bypass circuitry in a scan chain in an integrated circuit design comprising:
   receiving an HDL description of the circuit design;
   wherein the HDL description includes a scan chain bypass circuitry insertion instruction that specifies how many scan cells to provide in scan bypass circuitry per input/output port pair of a circuit block bypassed by the scan chain;
   wherein the scan chain bypass circuitry insertion instruction includes a user-selectable option of at least zero or one or two scan cells per input/output port pair;
   in response to the HDL description and the scan chain bypass circuitry insertion instruction, automatically generating a netlist portion that includes the scan chain bypass circuitry that is interconnected in the scan chain and that includes the specified number of scan cells per input/output port pair.

2. The computer implemented process of claim 1 wherein said HDL description comprises a VHDL description.

3. The computer implemented process of claim 1 wherein said HDL description comprises a Verilog description.

4. The computer implemented process of claim 1 wherein said scan bypass circuitry is capable of setting a signal output responsive to a test signal.

5. The computer implemented process of claim 1,
   wherein the HDL description includes a port specification that specifies port properties of a bypassed block.

6. The computer implemented process of claim 1,
   wherein the HDL description includes a port specification that specifies input/output port pairs of a block to be bypassed by a scan chain.

7. The computer implemented process of claim 1,
   wherein the HDL description includes a port specification that specifies which output pins and which output pins of a block to be bypassed by a scan chain are to be subject to the specified number of scan cells per input/output port pair.

8. An article of manufacture comprising:
a computer readable medium encoded with,
an HDL description of a circuit design;
wherein the HDL description includes a scan chain bypass circuitry insertion instruction that specifies how many scan cells to provide in scan bypass circuitry per input/output port pair of a circuit block bypassed by the scan chain;
wherein the scan chain bypass circuitry insertion instruction includes a user-selectable option of at least zero or one or two scan cells per input/output port pair; and
computer program code that automatically generates a netlist portion that includes the scan chain bypass circuitry that includes the specified number of scan cells per input/output port pair in response to the HDL description and the instruction.

9. The article of manufacture of claim 8, wherein said HDL description comprises a VHDL description.

10. The article of manufacture of claim 8, wherein said HDL description comprises a Verilog description.

11. The article of manufacture of claim 8, wherein said scan bypass circuitry is capable of setting a signal output responsive to a test signal.

12. The article of manufacture of claim 8,
wherein the HDL description includes a port specification that specifies port properties of a bypassed block.

13. The article of manufacture of claim 8,
wherein the HDL description includes a port specification that specifies input/output port pairs of a block to be bypassed by a scan chain.

14. The article of manufacture of claim 8,
wherein the HDL description includes a port specification that specifies which input pins and which output pins of a block to be bypassed by a scan chain are to be subject to the specified number of scan cells per input/output port pair.

* * * * *